US011948983B2

(12) United States Patent
Hu et al.

(10) Patent No.: US 11,948,983 B2
(45) Date of Patent: Apr. 2, 2024

(54) METHOD FOR PREPARATING SIC OHMIC CONTACT WITH LOW SPECIFIC CONTACT RESISTIVITY

(71) Applicant: Xidian University, Xi'an (CN)

(72) Inventors: Yanfei Hu, Xi'an (CN); Hui Guo, Xi'an (CN); Yuming Zhang, Xi'an (CN); Jiabo Liang, Xi'an (CN); Yanjing He, Xi'an (CN); Hao Yuan, Xi'an (CN); Yuting Ji, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 227 days.

(21) Appl. No.: 17/497,998

(22) Filed: Oct. 11, 2021

(65) Prior Publication Data
US 2022/0037480 A1 Feb. 3, 2022

Related U.S. Application Data

(63) Continuation of application No. PCT/CN2020/130352, filed on Nov. 20, 2020.

(30) Foreign Application Priority Data

Jul. 31, 2020 (CN) .......................... 202010760136.8

(51) Int. Cl.
*H01L 29/40* (2006.01)
*H01L 21/02* (2006.01)
(Continued)

(52) U.S. Cl.
CPC ...... *H01L 29/401* (2013.01); *H01L 21/02378* (2013.01); *H01L 21/02527* (2013.01);
(Continued)

(58) Field of Classification Search
CPC ............. H01L 29/401; H01L 21/02378; H01L 21/02527; H01L 21/0262; H01L 21/043;
(Continued)

(56) References Cited

U.S. PATENT DOCUMENTS

| 2008/0146004 A1* | 6/2008 | Matocha ............. H01L 21/0465 |
| | | 438/478 |
| 2012/0164767 A1* | 6/2012 | Gasse ................... H01L 27/153 |
| | | 257/E33.061 |

(Continued)

FOREIGN PATENT DOCUMENTS

| CN | 102064189 A * | 5/2011 |
| CN | 102064189 A | 5/2011 |

(Continued)

OTHER PUBLICATIONS

Hertel Stefan et al. "Graphene Ohmic Contacts ton-type Silicon Carbide (0001)" Materials Science Forum, vol. 821-823, Jun. 30, 2015, p. 933 to 936, ISSN: 1662-9752 (Year: 2015).*

(Continued)

*Primary Examiner* — Kimberly N Rizkallah
*Assistant Examiner* — Zhijun Xu
(74) *Attorney, Agent, or Firm* — WPAT, P.C

(57) ABSTRACT

A SiC ohmic contact preparation method is provided and includes: selecting a SiC substrate; preparing a graphene/SiC structure by forming a graphene on a Si-face of the SiC substrate; depositing an Au film on the graphene of the graphene/SiC structure; forming a first transfer electrode pattern on the Au film by a first photolithography; etching the Au film uncovered by the first transfer electrode pattern through a wet etching; etching the graphene uncovered by the Au film through a plasma etching after the wet etching; forming a second transfer electrode pattern on the SiC substrate by a second photolithography; depositing an Au material on the Au film exposed by the second transfer electrode pattern and forming an Au electrode and then annealing. The graphene reduces potential barrier associated with the SiC interface, specific contact resistance of ohmic (Continued)

contact reaches the order of $10^{-7}$~$10^{-8}$ $\Omega \cdot cm^2$, and the method has high repeatability.

10 Claims, 6 Drawing Sheets

(51) Int. Cl.
   *H01L 21/04* (2006.01)
   *H01L 29/165* (2006.01)
   *H01L 29/45* (2006.01)
   *H01L 29/16* (2006.01)

(52) U.S. Cl.
   CPC ........ *H01L 21/0262* (2013.01); *H01L 21/043* (2013.01); *H01L 21/0485* (2013.01); *H01L 29/165* (2013.01); *H01L 29/45* (2013.01); *H01L 29/1606* (2013.01); *H01L 29/1608* (2013.01)

(58) Field of Classification Search
   CPC ... H01L 21/0485; H01L 29/165; H01L 29/45; H01L 29/1606; H01L 29/1608; H01L 21/02425; H01L 21/02661
   See application file for complete search history.

(56) References Cited

U.S. PATENT DOCUMENTS

| | | | |
|---|---|---|---|
| 2018/0069081 A1* | 3/2018 | Nagasawa | H01L 21/02612 |
| 2018/0175153 A1* | 6/2018 | Schulze | H01L 29/1095 |
| 2021/0098590 A1* | 4/2021 | Xie | H01L 29/1608 |

FOREIGN PATENT DOCUMENTS

| | | | |
|---|---|---|---|
| CN | 103117298 A | * | 5/2013 |
| CN | 103117298 A | | 5/2013 |

OTHER PUBLICATIONS

Hertel Stefan et al. "Graphene Ohmic Contacts to n-type Silicon Carbide (0001)", Materials Science Forum, vol. 821-823. Jun. 30, 2015, ISSN: 1662-9752, p. 933 line 1 to p. 936 line 26.

International Search Report for PCT Application No. PCT/CN2020/130352, dated Mar. 29, 2021, SIPO.

* cited by examiner

```
┌─────────────────────────────────────────────────────────────────────┐
│ Selecting a SiC substrate                                           │
└─────────────────────────────────────────────────────────────────────┘
                                   │
┌─────────────────────────────────────────────────────────────────────┐
│ Forming a graphene/SiC structure by epitaxially growing a graphene  │
│ on a Si-face of the SiC substrate                                   │
└─────────────────────────────────────────────────────────────────────┘
                                   │
┌─────────────────────────────────────────────────────────────────────┐
│ Depositing an Au film on the graphene of the graphene/SiC structure │
└─────────────────────────────────────────────────────────────────────┘
                                   │
┌─────────────────────────────────────────────────────────────────────┐
│ Forming a first transfer electrode pattern on the Au film by a      │
│ first photolithography                                              │
└─────────────────────────────────────────────────────────────────────┘
                                   │
┌─────────────────────────────────────────────────────────────────────┐
│ Etching the Au film uncovered by the first transfer electrode       │
│ pattern through a wet etching                                       │
└─────────────────────────────────────────────────────────────────────┘
                                   │
┌─────────────────────────────────────────────────────────────────────┐
│ Etching the graphene uncovered by the Au film through a plasma      │
│ etching after the wet etching                                       │
└─────────────────────────────────────────────────────────────────────┘
                                   │
┌─────────────────────────────────────────────────────────────────────┐
│ Forming a second transfer electrode pattern on the SiC substrate    │
│ by a second photolithography                                        │
└─────────────────────────────────────────────────────────────────────┘
                                   │
┌─────────────────────────────────────────────────────────────────────┐
│ Depositing an Au material on the Au film exposed by the second      │
│ transfer electrode pattern                                          │
└─────────────────────────────────────────────────────────────────────┘
                                   │
┌─────────────────────────────────────────────────────────────────────┐
│ Stripping off the second transfer electrode pattern to form an Au   │
│ electrode and then annealing                                        │
└─────────────────────────────────────────────────────────────────────┘
```

FIG. 1

```
┌─────────────────────────────────────────────────────────────────────┐
│ Selecting a SiC substrate                                           │
└─────────────────────────────────────────────────────────────────────┘
                                    │
┌─────────────────────────────────────────────────────────────────────┐
│ Implanting N ions into a C-face of the SiC substrate with a preset  │
│ depth and a preset concentration                                    │
└─────────────────────────────────────────────────────────────────────┘
                                    │
┌─────────────────────────────────────────────────────────────────────┐
│ Forming a graphene/SiC structure by epitaxially growing a of        │
│ graphene on a Si-face of the SiC substrate                          │
└─────────────────────────────────────────────────────────────────────┘
                                    │
┌─────────────────────────────────────────────────────────────────────┐
│ Depositing an Au film on the graphene of the graphene/SiC structure │
└─────────────────────────────────────────────────────────────────────┘
                                    │
┌─────────────────────────────────────────────────────────────────────┐
│ Sputtering a Ni metal on the C-face of SiC substrate implanted with │
│ N ions to form a Ni electrode                                       │
└─────────────────────────────────────────────────────────────────────┘
                                    │
┌─────────────────────────────────────────────────────────────────────┐
│ Forming a first transfer electrode pattern on the Au film by a      │
│ first photolithography                                              │
└─────────────────────────────────────────────────────────────────────┘
                                    │
┌─────────────────────────────────────────────────────────────────────┐
│ Etching the Au film uncovered by the first transfer electrode       │
│ pattern through a wet etching                                       │
└─────────────────────────────────────────────────────────────────────┘
                                    │
┌─────────────────────────────────────────────────────────────────────┐
│ Etching the graphene uncovered by the Au film through a plasma      │
│ etching after the wet etching                                       │
└─────────────────────────────────────────────────────────────────────┘
                                    │
┌─────────────────────────────────────────────────────────────────────┐
│ Forming a second transfer electrode pattern on the SiC substrate    │
│ by a second photolithography                                        │
└─────────────────────────────────────────────────────────────────────┘
                                    │
┌─────────────────────────────────────────────────────────────────────┐
│ Depositing an Au material on the Au film exposed by the second      │
│ transfer electrode pattern                                          │
└─────────────────────────────────────────────────────────────────────┘
                                    │
┌─────────────────────────────────────────────────────────────────────┐
│ Stripping off the second transfer electrode pattern to form an Au   │
│ electrode and then annealing                                        │
└─────────────────────────────────────────────────────────────────────┘
```

FIG. 3

Selecting a SiC substrate

Forming a graphene/SiC structure by epitaxially growing of a graphene on a Si-face of the SiC substrate Depositing an Au film on a graphene of the graphene/SiC structure Sputtering a Ni metal on the C-face of SiC substrate implanted with N ions to form a Ni electrode Forming a first transfer electrode pattern on the Au film by a first photolithography Etching the Au film uncovered by the first transfer electrode pattern through a wet etching Etching the graphene uncovered by the Au film through a plasma etching Forming a second transfer electrode pattern on the SiC substrate by a second photolithography Etching the Au film uncovered by the first transfer electrode pattern through a wet etching Forming a third transfer electrode pattern on the SiC substrate and the graphene by a third photolithography Depositing an Au material on the Au film to form an Au electrode and then annealing

FIG. 5

METHOD FOR PREPARING SIC OHMIC CONTACT WITH LOW SPECIFIC CONTACT RESISTIVITY

FIELD OF THE DISCLOSURE

The disclosure relates to the field of silicon carbide (SiC) ohmic contact technologies, and more particularly to a SiC ohmic contact preparation method.

BACKGROUND OF THE DISCLOSURE

SiC has irreplaceable advantages in extreme conditions such as a high temperature, a high power and an irradiation due to its excellent properties such as wide bandgap, high thermal conductivity and high breakdown electric field, and has attracted much attention in various fields of application.

At present, the shrinking characteristic size of devices has put forward higher requirements for ohmic contact. Parasitic resistance and parasitic capacitance have been perplexing the improvement of the device's performance, which greatly limits the frequency of those devices. The parasitic resistance is mainly from contact, and the improvement of ohmic contact quality is the key to improve the performance of the devices. When specific contact resistance of ohmic contact be reduced lower, the power consumption and signal loss of devices caused by contact become smaller, as a result, those devices acquire the higher efficiency and accuracy. Therefore, for a long time, researchers at home and abroad have been committed to reducing the specific contact resistance of ohmic contact to obtain more stable contact structure. SiC can form ohmic contact with nickel (Ni), titanium (Ti), cobalt (Co), tantalum (Ta), other metals and their alloys. Herein, a standard ohmic contact process has been formed between SiC and Ni which has higher repeatability and specific contact resistance ($1\times10^{-5}\pi\cdot cm^2$). However, there is no consensus on the formation mechanism of SiC ohmic contact. At present, it is generally accepted that metal and SiC is alloyed at their contact interface after annealing under certain conditions and a large number of carbons (C) vacancies and empty bands are formed due to the external diffusion of C atoms from SiC substrate, which is equivalent to increasing the concentration of effective carrier in contact region. As a result, the width of depletion region become thinning which will strengthen tunneling effect of effective carriers, and this ohmic contact acquires lower specific contact resistance. The existing ohmic contact process roughly includes: doping the substrate to form a box shape impurity distribution with a certain concentration and depth; sputtering a metal electrode; performing a rapid thermal annealing for alloy formation at contact region to form ohmic contact. The researchers at home and abroad have been studying and optimizing the composition and forming process of ohmic contact metal of SiC for a long time, and have achieved considerable achievements in reducing specific contact resistance of the ohmic contact. The specific contact resistance of the order of $10^{-4}\sim10^{-6}$ $\pi\cdot cm^2$ can be obtained for a Ni based ohmic contact and a Ti based ohmic contact of SiC with relatively mature processes.

However, due to the still immature theoretical and technological researches of SiC ohmic contact technology, and a low repeatability of the experiment, the specific contact resistance is basically the order of $10^{-5}$ $\pi\cdot cm^2$ in practical application, and it is difficult to make a higher breakthrough.

SUMMARY OF THE DISCLOSURE

In order to solve the above problems in the related art, the disclosure provides a silicon carbide (SiC) ohmic contact preparation method.

In particular, a SiC ohmic contact preparation method according to an embodiment of the disclosure may include:
selecting a SiC substrate;
preparing a graphene/SiC structure by epitaxially growing a graphene on a silicon-face (Si-face) of the SiC substrate;
depositing a gold (Au) film on the graphene of the graphene/SiC structure;
forming a first transfer electrode pattern on the Au film by a first photolithography;
etching the Au film uncovered by the first transfer electrode pattern through a wet etching;
etching the graphene uncovered by the Au film through a plasma etching after the wet etching;
forming a second transfer electrode pattern on the SiC substrate by a second photolithography; and
depositing an Au material on the Au film exposed by the second transfer electrode pattern and forming an Au electrode and then annealing, so as to obtain a SiC ohmic contact.

In an embodiment of the disclosure, the preparing a graphene/SiC structure by epitaxially growing a graphene on a Si-face of the SiC substrate may include: using a chemical vapor deposition (CVD) equipment to prepare the graphene-SiC structure through a thermal method of epitaxially growing graphene on the SiC substrate, and the process conditions including: cutting off hydrogen and silicon-tetrahydride ($SiH_4$), introducing in 2 liters per minute (L/min) of argon gas, maintaining a pressure in the CVD equipment at 5 mbar, heating up to 1650° C., and a pyrolysis time being 30 minutes (min)~1.5 hours (h).

In an embodiment of the disclosure, the depositing an Au film on the graphene of graphene/SiC structure may include: using an electron beam evaporation to deposit the Au film of thickness of 20~30 nanometers (nm) on the graphene of graphene/SiC structure, and the process conditions including that: a molybdenum crucible is used, a temperature of the graphene/SiC structure is dropped to room temperature at a vacuum level of $10^{-7}$ Torr, an evaporation distance is 60 centimeters (cm), a voltage of an electron gun is 10 kilovolts (kV), electron gun current is 1 ampere (A) and an evaporation rate is 1 nanometer per second (nm/s).

In an embodiment of the disclosure, the depositing an Au material on the Au film exposed by the second transfer electrode pattern may include: using an electron beam evaporation to deposit the Au material with a thickness of 200~300 nm on the Au film exposed by the second transfer electrode pattern, and the process conditions may include that: a molybdenum crucible is used, a temperature of a composite structure with the Au film and the graphene/SiC structure is dropped to room temperature at a vacuum level of $10^{-7}$ Torr, an evaporation distance is 60 cm, a voltage of an electron gun is 10 kV, a current of the electron gun is 1 A and an evaporation rate is 1 nm/s.

In an embodiment of the disclosure, after the depositing Au material on the Au film exposed by the second transfer electrode pattern, stripping off the second transfer electrode pattern to form the Au electrode and then annealing may include:
stripping off the second transfer electrode pattern to form the Au electrode, and process conditions of the stripping off may include: soaking a composite structure with the Au material, the Au film and the graphene/SiC structure in acetone for 12 h; sucking up a cocked Au metal by a disposable burette; taking out the soaked composite structure, cleaning with acetone ethanol, and drying by a nitrogen gas gun; and carrying out the annealing, and process conditions of the annealing may sequentially include: vacuuming to 4 mbar, introducing nitrogen gas, then vacuuming to 4 mbar again, and continuing to introduce nitrogen gas of which a flow rate is 2000 standard cubic centimeter per minute (sccm); heating up to 400° C. and maintaining for 10 seconds (s); heating up to 600° C. at 10° C./s, and maintaining for 30 minutes (min); and cooling with cooling water for 420 s.

In an embodiment of the disclosure, the preparing a graphene/SiC structure by forming a graphene on a Si-face of the SiC substrate includes: transferring the graphene on the Si-face of the SiC substrate to prepare the graphene/SiC structure.

In an embodiment of the disclosure, the transferring graphene on the Si-face of the SiC substrate to prepare graphene/SiC structure may include:

selecting a copper foil and using a CVD equipment to grow the graphene on the copper foil, and the process conditions may sequentially include: introducing 1000 sccm of argon gas into the CVD equipment and heating up to 1000° C. at 200° C./min; shutting down the argon gas and introducing in 1000 sccm of hydrogen gas for 5 min; gradually changing the introduced gas to be 960 sccm of argon gas and 40 sccm of hydrogen gas and then introducing 10 sccm of methane gas for 10 min; and shutting down the source of the methane gas, cooling down to 300° C. at 200° C./min, then cooling down to 150° C. naturally, closing all gas sources, and vacuuming to 0.1 mbar;

spin-coating a polymethyl methacrylate (PMMA) solution onto a surface of the graphene, removing the copper foil by corrosive solution to form a PMMA/graphene composite structure, and floating the PMMA/graphene composite structure on the corrosive solution, and the process conditions may include: a spin-coating speed is 3000 revolutions per minute (rpm), a spin-coating time is 1 min, the corrosive solution is a ferric chloride solution of 0.5 mole per liter (mol/L), and a corrosion time is 4 h;

using the SiC substrate to transfer the PMMA/graphene composite structure from the corrosive solution to thereby form a PMMA/graphene/SiC structure composite structure and then cleaning, and the process conditions may sequentially include: tilting the SiC substrate at an angle by a tweezer, placing the SiC substrate directly below the PMMA/graphene composite structure, and lifting the SiC substrate; placing the PMMA/graphene/SiC composite structure into a solution of $H_2O:H_2O_2:HCl=20:1:1$ for 30 min; then placing the composite structure into another solution of $H_2O:H_2O_2:NH_4OH=5:1:1$ for 30 min; and subsequently repeatedly cleaning the composite structure by deionized water; and drying the water between the graphene and the SiC substrate; and removing the PMMA from PMMA/graphene/SiC structure and annealing to form the graphene/SiC structure, and the process conditions may sequentially include: removing the PMMA by hot acetone, washing with ethanol solution, and cleaning repeatedly with deionized water; and vacuum annealing, concretely in a mixed atmosphere of hydrogen gas and argon gas, annealing at 200° C.~400° C. for 3 h.

In an embodiment of the disclosure, the preparation method may further include: implanting N ions into a carbon-face (C-face) of the SiC substrate with a preset depth and a preset concentration; and sputtering a nickel (Ni) on the C-face of the SiC substrate implanted with N ions to form a Ni electrode.

In an embodiment of the disclosure, the implanting N ions into a C-face of the SiC substrate with a preset depth and a preset concentration may include: using a CVD equipment to grow a masking layer with a thickness of 80~120 nm on the C-face of the SiC substrate; implanting the N ions through the masking layer into the SiC substrate with the preset depth of 300~350 nm and the preset concentration of $0.99 \times 10^{20}$~$1.01 \times 10^{20}$ cm$^{-3}$; and etching off the masking layer by a plasma etching after the implanting.

Another embodiment of the disclosure provides a SiC ohmic contact preparation method, may include:

selecting a SiC substrate;

forming a graphene/SiC composite structure by epitaxially growing a graphene on a Si-face of the SiC substrate;

depositing an Au film on the graphene of the graphene/SiC composite structure;

forming a Ni electrode by sputtering a Ni metal on a C-face of the SiC substrate;

forming a first transfer electrode pattern on the Au film by a first photolithography;

etching the Au film uncovered by the first transfer electrode pattern by a wet etching;

etching the graphene uncovered by the Au film by a plasma etching;

forming a second transfer electrode pattern on the Au film by a second photolithography;

etching the Au film uncovered by the second transfer electrode pattern through a wet etching;

depositing an Au material on the Au film to form an Au electrode and then annealing, so as to achieve a SiC ohmic contact.

Compared with the prior art, the invention has beneficial effects:

the SiC ohmic contact preparation method provided by the disclosure is a practical preparation solution/scheme. The existence/presence of graphene reduces the potential barrier associated with the contact interface, which breaks through the current specific contact resistance of the order of $10^{-5}$ Ω·cm$^2$ in practical applications from a new approach, and further reduces the specific contact resistance of ohmic contact. The specific contact resistance of the embodiment can reach the order of $10^{-7}$~$10^{-8}$ Ω·cm$^2$, which can reduce unnecessary power consumption and signal loss caused by ohmic contact and thereby improve the performance of the device. What's more, the SiC ohmic contact preparation method has high repeatability.

The disclosure will be further described in detail below in conjunction with accompanying drawings and embodiments.

BRIEF DESCRIPTION OF THE DRAWINGS

FIG. 1 is a flowchart of a SiC ohmic contact preparation method according to an embodiment of the disclosure.

FIG. 3 is a flowchart of another SiC ohmic contact preparation method according to an embodiment of the disclosure.

FIG. 5 is a flowchart of still another SiC ohmic contact preparation method according to an embodiment of the disclosure.

DETAILED DESCRIPTION OF EMBODIMENTS

The disclosure will be further described in detail in combination with specific embodiments, but embodiments of the disclosure are not limited to these.

First Embodiment

In order to further reduce the specific contact resistance of an ohmic contact, reduce unnecessary power consumption and signal loss caused by the ohmic contact, and thereby improve the performance of a device, referring to FIG. 1 and FIG. 2a-FIG. 2h, FIG. 1 is a flowchart of a SiC ohmic contact preparation method (also referred to as a method for preparing/fabricating/manufacturing a SiC ohmic contact) according to an embodiment of the disclosure, FIG. 2a-FIG. 2h are schematic structural views associated with the SiC ohmic contact preparation method according to an embodiment of the disclosure. A SiC ohmic contact preparation method as provided in an illustrated embodiment may include the following step 1 through step 9.

Step 1, selecting a SiC (Silicon Carbide) substrate.

Specifically, the step of selecting a SiC substrate in the illustrated embodiment may include:

selecting a SiC substrate with a surface orientation of (0001) to obtain a selected SiC substrate;

performing a standard RCA cleaning on the selected SiC substrate to obtain a cleaned SiC substrate;

performing a hydrogen etching on a surface of the cleaned SiC substrate, specific process conditions of the hydrogen etching may be that: an etching temperature is 1600° C., an etching time is 90 min, an etching pressure is 96 mbar, and a hydrogen flow rate is 90 L/min; and removing surface derivative of the SiC substrate after the hydrogen etching, specific process conditions of the removing sequentially may be that: slowly reducing the temperature from 1600° C. to 1000° C., and introducing 2 L/min of hydrogen gas for 15 minutes; cooling down to 850° C., and introducing 0.5 ml/min of silicon-tetrahydride ($SiH_4$) at a low vacuum level (pressure being 10 e5~10 e2 Pa) for 10 minutes; heating up to 1000° C. and maintaining for 5 minutes; raising the temperature up to 1100° C. under the low vacuum level and maintaining for 5 minutes; and heating up to 1250° C. and maintaining for 10 minutes.

Figure 2A:
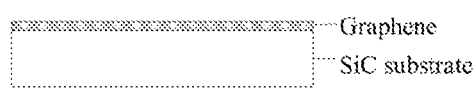
FIGS. 2a-2h are schematic structural views associated with the SiC ohmic contact preparation method according to an embodiment of the disclosure.

Step 2, referring to FIG. 2a, forming a graphene/SiC structure (i.e., a composite structure of graphene/SiC) by epitaxially growing a graphene on the SiC substrate.

Specifically, a relatively high requirement of the ohmic contact to an interface state, the more smooth/flat contact surface, the more stable ohmic contact with a lower specific contact resistance often can be obtained. Therefore, the graphene is chosen as an intermediate layer in the illustrated embodiment to replace a carbon-rich layer used in a traditional preparation method. The graphene is an ideal two-dimensional system composed of carbon atoms and has ultra-high electrical conductivity and carrier mobility, a carbon-carbon double bond structure of the graphene makes the graphene be very solid/strong and stable. Moreover, the surface of the graphene is very flat/smooth, and a roughness of the graphene surface is about a few nanometers and lower one order of magnitude than that of the SiC substrate after surface treatment. In the illustrated embodiment, an epitaxial growth method is used for epitaxially growing the graphene on the SiC substrate to form the graphene/SiC structure.

Specifically, a chemical vapor deposition (CVD) equipment is used to epitaxially grow the graphene on the SiC substrate by a thermal growth method to thereby form the graphene/SiC structure. According to an analysis of difference of surface orientations of SiC substrate, in this embodiment, the graphene is epitaxially grown on the Si-face (i.e., SiC—Si-face) of the SiC substrate to form the graphene/SiC structure. The specific process conditions may be that: stopping introducing hydrogen and $SiH_4$, introducing 2 L/min of argon gas, maintaining a pressure in the chamber of the CVD equipment at 5 mbar, heating up to 1650° C. and a pyrolysis time being 30 min~1.5 h, and thereby obtaining an epitaxial graphene of 1~3 layers. In particular, when the pyrolysis time is 30 min, the epitaxial graphene of single layer may be obtained; when the pyrolysis time is 1 hour, the epitaxial graphene of two layers may be obtained; and when the pyrolysis time is 1.5 h, the epitaxial graphene of three layers may be obtained. The more layers of the epitaxial graphene, the easier it is to obtain a more complete graphene plane, so that the ohmic contact performance is better.

In another illustrated embodiment, the graphene can be transferred onto the Si-face of the SiC substrate to form graphene/SiC structure by graphene transferring instead.

Specifically, a copper foil with a thickness of 25 μm and a purity with a mass ratio of 99.99% is selected and a standard RCA cleaning is performed on the copper foil, and then the copper foil after the cleaning is placed in a reaction chamber of a CVD equipment, and subsequently the graphene is grown on the copper foil. The specific process conditions of graphene growth sequentially may be that: introducing 1000 sccm of argon gas into the CVD equipment as a protection gas, and heating up to 1000° C. at 200° C./min (degree Celsius per minute); shutting down the argon gas, and introducing 1000 sccm of hydrogen for 5 min; gradually changing the introduced gas to be 960 sccm of argon gas and 40 sccm of hydrogen; and then introducing 10 sccm of methane gas for 10 min; shutting down the methane gas source, cooling down to 300° C. at 200° C./min, then cooling down to 150° C. naturally, closing all gas sources, and vacuuming to 0.1 mbar.

After the growth of graphene on the copper foil, a surface of the copper foil without graphene is pasted/attached onto a thermal releasable tape, and a polymethyl methacrylate (PMMA) solution is spin-coated onto a surface of the graphene, and the copper foil is removed by a corrosive solution. Because of the water tension, the copper foil floats on the surface of the corrosive solution. After corrosion the copper foil is removed to form a PMMA/graphene structure, and the PMMA/graphene structure still floats on the corrosive solution. The specific process conditions may be that: a solvent in the PMMA solution is an ethyl lactate with a molecular weight of 960K and a mass ratio of 4% (4 wt %); a uniform rotation speed is 3000 rpm, and a spin-coating time is 1 min; a temperature of a hot plate (the thermal releasable tape) is set to be 160° C., drying a sample (i.e., copper foil/graphene/PMMA structure adhered onto the thermal releasable tape) and maintaining for 10 min, and as a result the copper foil and the thermal releasable tape can be separated from each other. After that, the copper foil/ graphene/PMMA structure is placed into a ferric chloride solution of 0.5 mol/L for 4 h.

The PMMA/graphene then is transferred from the corrosive solution to form a PMMA/transferred graphene/SiC structure by using the SiC substrate processed in the above step 1 and a cleaning process subsequently is carried out. The specific process conditions may be that: tilting the SiC substrate to a certain angle by a tweezer, and placing the tilted SiC substrate directly below the PMMA/transferred graphene structure, and gently lifting the SiC substrate to form the PMMA/transferred graphene/SiC structure; placing the PMMA/transferred graphene/SiC structure into a solution of $H_2O:H_2O_2:HCl=20:1:1$ for 30 min to remove ions and heavy metal atoms; then placing it into another solution of $H_2O:H_2O_2:NH_4OH=5:1:1$ for 30 min to remove insoluble organic pollutants; and after repeated cleanings by deionized water, drying water between the transferred graphene and the SiC substrate. There are two ways to dry the water between the transferred graphene and the SiC substrate. One way is to dry the water between the transferred graphene and the SiC substrate by using a nitrogen gas gun, and the other way is to touch edges of the transferred graphene lightly by a filter paper to absorb the water under the transferred graphene.

The transferred graphene/SiC structure is formed by removing the PMMA and annealing. The specific process conditions may sequentially include that: removing the PMMA by a hot acetone, washing with an ethanol solution by several times, and cleaning repeatedly with deionized water; and low vacuum annealing in a mixed atmosphere of hydrogen and argon gas, annealing at a temperature of 200° C.~400° C. for 3 hours. Before removing the PMMA, the PMMA/transferred graphene/SiC can be placed in a ventilation place for drying and after the transferred graphene is completely attached onto the SiC substrate, it is baked by the hot plate where a baking temperature is 150° C.~200° C. and a baking time is about 10 min. The baking can soften the PMMA film to have flexibility while removing water, so that gaps between the transferred graphene and the SiC substrate can be reduced and their bonding is better consequently.

It is noted that the graphene in the graphene/SiC structures in the illustrated embodiments can be formed by the above-mentioned graphene transferring method and the thermal epitaxial growth method, and the resultant structures each are the graphene/SiC. The graphene mentioned in the subsequent steps of the first embodiment is the transferred graphene or the epitaxially grown graphene.

Figure 2B:
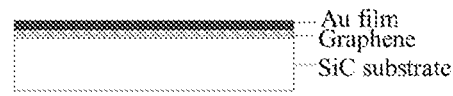

Step 3, referring to FIG. 2b, depositing an Au (gold) film on the graphene of the graphene/SiC structure.

Specifically, in the illustrated embodiment, an electron beam evaporation method is used to deposit the Au film with a thickness of 20 nm-30 nm on the graphene of the graphene/SiC. The specific process conditions may be that: a molybdenum crucible is used, a temperature of the graphene/SiC structure is dropped to the room temperature at a high vacuum level of $10^{-7}$ Torr, an evaporation distance is 60 cm, a voltage of an electron gun is 10 kV, a current of the electron gun is 1 A, and an evaporation rate is 1 nm/s. A key factor of the illustrated embodiment lies in the protection of integrity of the graphene during the ohmic contact preparation process, this is because the damage of the graphene at the interface would make the graphene/SiC structure meaningless and seriously affect the ohmic contact properties. Therefore, in the illustrated embodiment, an Au film with the thickness of 20~30 nm is pre-deposited in the process to protect the graphene from being doped and damaged, and the integrity of graphene is protected, so that a success rate of ohmic contact is improved.

Figure 2C:
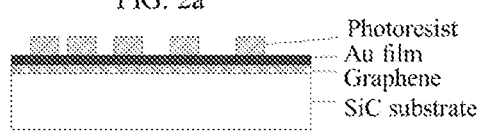

Step 4, referring to FIG. 2c, forming a first transfer electrode pattern on the Au film by a first photolithography.

Specifically, in the illustrated embodiment, the first transfer electrode pattern (e.g., the patterned photoresist shown in FIG. 2c) is formed by photolithography. The specific process conditions may sequentially include that: spin-coating a photoresist on the Au film at 4000 rpm for 1 min; baking by a hot plate, where a baking temperature is 100° C.; using a mask plate for exposure of 21 mJ/cm$^2$; baking for 90 s on the hot plate of 110° C. and doing/performing flood exposure of 400 mJ/cm$^2$; and developing, concretely soaking the sample in a developing solution of photoresist (such as xylene), gently shaking for 60 s, taking it out, rinsing with deionized water, and drying with a nitrogen gas gun. The sample is the Au film/graphene/SiC composite structure formed after the step 3.

Figure 2D:
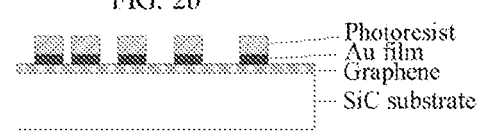

Step 5, referring to FIG. 2d, etching the Au film uncovered by the first transfer electrode pattern through a wet etching.

Specifically, in the illustrated embodiment, a potassium iodide solution is used to etch the Au film uncovered by the first transfer electrode pattern by wet etching, that is, to remove the Au film between electrodes.

Figure 2E:
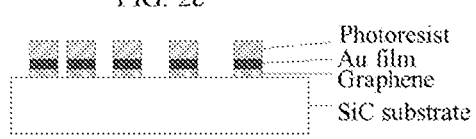

Step 6, referring to FIG. 2e, etching the graphene uncovered by the Au film through a plasma etching.

Specifically, in the illustrated embodiment, an oxygen plasma etching method is used to remove the graphene uncovered by the Au film. The specific process conditions may be that: an oxygen flow rate is 50 sccm, an ICP (Inductive Coupled Plasma) power is 500 W, a HF (High Frequency) power is 7 W, and an etching time is 15 s.

Figure 2F:
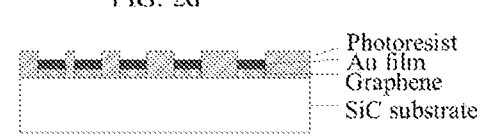

Step 7, referring to FIG. 2f, forming a second transfer electrode pattern on the SiC substrate by a second photolithography.

Specifically, before forming the second transfer electrode pattern (e.g., patterned photoresist shown in FIG. 2f) in the illustrated embodiment, acetone is first used for soaking to remove the photoresist of the first transfer electrode pattern, and then the sample is cleaned by deionized water. After that, the second transfer electrode pattern is formed by a photolithography method. The specific process conditions may sequentially include that: spin-coating a photoresist on the SiC substrate at 4000 rpm for 1 min; using a mask plate for exposure of 21 mJ/cm$^2$; baking for 90 s on a hot plate of 110° C. and doing flood exposure of 400 mJ/cm$^2$; and developing, concretely soaking the sample in an AZ developing solution of TMAH 2.38%, gently shaking for 60 s, taking it out, rinsing with acetone alcohol, and drying with a nitrogen gas gun. The sample is the Au film/graphene/SiC composite structure formed after the step 6.

Figure 2G:
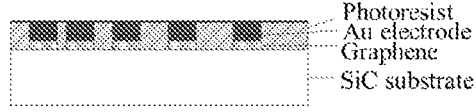

Step 8, referring to FIG. 2g, depositing an Au material on the Au film exposed by the second transfer electrode pattern.

Specifically, in the illustrated embodiment, an electron beam evaporation method is used to deposit the Au material with a thickness of 200 nm~300 nm on the Au film exposed by the second transfer electrode pattern. The specific process conditions may be that: a molybdenum crucible is used, a temperature of the Au film/graphene/SiC composite structure formed after the step 6 is dropped to the room temperature at a high vacuum level of $10^{-7}$ Torr, an evaporation distance is 60 cm, a voltage of an electron gun is 10 kV, a current of the electron gun is 1 A, and an evaporation rate is 1 nm/s.

Figure 2H:
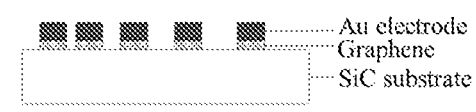

Step 9, referring to FIG. 2h, stripping off the second transfer electrode pattern to form Au electrodes and then annealing, and thereby completing the preparation of a new SiC ohmic contact of ultra-low contact resistance.

Specifically, in the illustrated embodiment, the photoresist of the second transfer electrode pattern finally is stripped off to form the Au electrodes and then an annealing process is carried out.

Specifically, as to the stripping off the second transfer electrode pattern to form the Au electrodes, specific process conditions may sequentially include that: soaking the sample in acetone for 12 h, sucking up a cocked Au metal by a disposable burette/dropper, taking out the sample, cleaning the sample with acetone ethanol, and drying the sample by using a nitrogen gas gun. The sample is the Au electrode/graphene/SiC composite structure formed after the step 8.

After that, the annealing is carried out, specific process conditions thereof may sequentially include that: cleaning the chamber before the annealing, concretely vacuuming to 4 mbar, introducing nitrogen gas, then vacuuming again to 4 mbar, and continuing to introduce nitrogen gas of which a flow rate is 2000 sccm (removing residual air in the chamber to ensure nitrogen gas purity); heating up to 400° C. and maintaining for 10 s; then heating up to 600° C. at 10° C./s and maintaining for 30 min; cooling with cooling water for 420 s to complete the annealing, and thereby completing/finishing the preparation of the new SiC ohmic contact of ultra-low contact resistance. The preparation of the new SiC ohmic contact of ultra-low contact resistance may be a preparation of SiC/single-layer epitaxial graphene/Au structure ohmic contact, a preparation of SiC/two-layer epitaxial graphene/Au structure ohmic contact, a preparation of SiC/three-layers epitaxial graphene/Au structure ohmic contact, or a preparation of SiC/single-layer transferred graphene/Au structure ohmic contact.

In summary, the method for preparing a SiC ohmic contact as provided in the illustrated embodiment is a feasible/practical preparation solution/scheme. The existence/presence of graphene reduces the potential barrier associated with the contact interface, which breaks through the current specific contact resistance of the order of $10^{-5}$ $\Omega \cdot cm^2$ in practical applications from a new approach, and further reduces the specific contact resistance of ohmic contact. The specific contact resistance of the embodiment can reach the order of $10^{-7} \sim 10^{-8} \Omega \cdot cm^2$, which can reduce unnecessary power consumption and signal loss caused by ohmic contact and thereby improve the performance of the device. what's more the preparation method has high repeatability. Moreover, the Au film with the thickness of 20 nm~30 nm is pre-deposited in the process, which can protect the graphene from being doped and damaged, protect the integrity of graphene, and consequently improve the success rate of the ohmic contact preparation.

Second Embodiment

In order to restrain diffusion and electromigration of a contact metal to a semiconductor under an ultra-high power condition or an irradiated environment on the basis of without increasing the specific contact resistance as much as possible, referring to FIG. 3 and FIG. 4a-FIG. 4j, FIG. 3 is a flowchart of another SiC ohmic contact preparation method according to an embodiment of the disclosure, FIGS. 4a-4j are schematic structural views associated with the another SiC ohmic contact preparation method according to an embodiment of the disclosure. In particular, another SiC ohmic contact preparation method as provided in the illustrated embodiment may include the following step 1 through step 11.

Step 1, selecting a SiC substrate.

Specifically, the step of selecting the SiC substrate in the illustrated embodiment may include:

selecting a SiC substrate with a surface orientation of (0001) to obtain a selected SiC substrate;

performing a standard RCA cleaning on the selected SiC substrate to obtain a cleaned SiC substrate;

performing a hydrogen etching on a surface of the cleaned SiC substrate, specific process conditions of the hydrogen etching may include that: an etching temperature is 1600° C., an etching time is 90 min, an etching pressure is 96 mbar, and a hydrogen flow rate is 90 L/min; and removing a surface derivative of the SiC substrate after the hydrogen etching, specific process conditions of the removing may sequentially include that: slowly reducing a temperature from 1600° C. to 1000° C., and introducing 2 L/min of hydrogen for 15 minutes; cooling down to 850° C., and introducing 0.5 ml/min of $SiH_4$ at a low vacuum level (pressure being 10 e5~10 e2 Pa) for 10 min; heating up to 1000° C. and maintaining for 5 min; raising the temperature to 1100° C. at the low vacuum level and maintaining for 5 min; and heating up to 1250° C. and maintaining for 10 min.

Figure 4A:
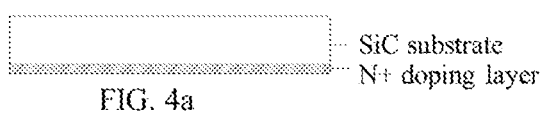
FIGS. 4a-4j are schematic structural views associated with another SiC ohmic contact preparation method according to an embodiment of the disclosure.

Step 2, referring to FIG. 4a, implanting N ions into a carbon-face (C-face) of the SiC substrate with a preset depth and a preset concentration.

Specifically, because the ions implantation to prepare an ohmic contact expects a box-shaped distribution of doping concentration, but the distribution available in a traditional ions implantation usually is a Gaussian distribution, so the illustrated embodiment first prepares a masking layer before ions implantation to accommodate the Gauss distribution which is not needed. In the illustrated embodiment, a CVD equipment is used to grow a $SiO_2$ masking layer of 80 nm~120 nm on the C-face of the SiC substrate. The specific process conditions may be that: an oxidation temperature is controlled to be 1180° C., an oxygen flow rate is 540 ml/min, and an oxidation time is controlled to be 165 min. After the completion of the oxidation process, the temperature of CVD equipment is kept unchanged (1180° C.) and $N_2$ gas is introduced to anneal for 30 min, and then the sample is cooled down to below 300° C. at the $N_2$ gas atmosphere. After the oxidation of SiC, annealing is needed to eliminate residual C atoms in the $SiO_2$ layer and thereby improve interface properties of $SiC/SiO_2$. The specific process conditions of the annealing may sequentially include that: vacuuming an annealing equipment to 4 mbar, introducing nitrogen gas, then vacuuming to 4 mbar, and introducing nitrogen gas of which a flow rate is 2000 sccm; heating up to 400° C. and maintaining for 10 s; heating up to 1000° C. and maintaining for 3 min; cooling down after the annealing and opening the chamber after cooling for 420 s by cooling water.

After the masking layer is fabricated/prepared, implanting N ions with a preset depth of 300~350 nm and a preset concentration of $0.99 \times 10^{20} \sim 1.01 \times 10^{20}$ $cm^{-3}$ via the masking layer into the SiC substrate. The specific process conditions may be that: implanting the N ions by four times, and energies/doses of the four times N ions implantations are 150 kev/$3.1 \times 10^{15}$ $cm^{-2}$, 100 keV/$1.75 \times 10^{15}$ $cm^{-2}$, 62 keV/$1.45 \times 10^{15}$ $cm^{-2}$, and 35 keV/$1.1 \times 10^{15}$ $cm^{-2}$ respectively, so as to realize the N ions implantation with the preset depth and concentration. The energies and doses for the N ions implantations in the illustrated embodiment can be any combination as long as meeting the distributions of the preset depth and the preset concentration. The control of the preset depth and the preset concentration has a great influence on the structure of the embodiment.

After the N ions are implanted, a plasma etching is used to etch the masking layer, and specific process conditions thereof may be that: a flow rate of $CF_4$ is 40 sccm, a RF (radio frequency) power is 400 W, a gas pressure is 5 Pa, and an etching time is 1.5 min. After the etching, a high temperature activation annealing of SiC substrate is carried out. In this case, process conditions of the high temperature activation may be that: vacuuming the annealing equipment to 4 mbar, introducing nitrogen gas, then vacuuming to 4 mbar, and introducing nitrogen gas of which a flow rate is 2000 sccm; heating up to 400° C. and maintaining for 10 s; heating up to 1700° C. at 10° C./s and maintaining for 30 min; and cooling down after the annealing and opening the chamber after cooling for 420 s by cooling water.

Figure 4B:
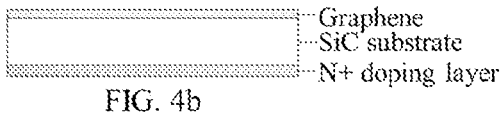

Step 3, referring to FIG. 4b, forming a graphene/SiC structure by epitaxially growing a graphene on a silicon-face (Si-face) of the SiC substrate.

Specifically, because of a relatively high requirement of the ohmic contact to an interface, the more smooth/flat contact surface, the more stable ohmic contact with a lower specific contact resistance usually can be obtained. This requirement can be fully satisfied by graphene. Moreover, the graphene still has the characteristics of impermeability, flexibility, rigidity and so on. Graphene is a good barrier/blocking material for metal atom diffusion and electromigration due to its impermeability. Graphene has a good rigidity and thus can withstand an extremely high current density stress in a power device. Therefore, in the illustrated embodiment, the impermeability and the ultra-high strength and flexibility of the graphene, make the device electrode can effectively prevent the electromigration phenomenon even if the device is applied to an ultra-high power condition or a harsh environmental condition of irradiation. In the illustrated embodiment, an epitaxial growth method of growing a graphene on the Si-face of the SiC substrate is used to form the graphene/SiC structure.

Specifically, a chemical vapor deposition (CVD) equipment is used to epitaxially grow graphene on the SiC substrate by a thermal growth method to thereby from the graphene/SiC structure. According to an analysis of difference of surface orientations of SiC substrate, in this embodiment, the graphene is epitaxially grown on the Si-face (SiC—Si-face) of the SiC substrate to form the graphene-SiC structure. The specific process conditions may sequentially include that: stopping introducing hydrogen and $SiH_4$, introducing of argon gas of 2 L/min, maintaining a pressure in the chamber of the CVD equipment at 5 mbar, heating up to 1650° C., and a pyrolysis time being 30 min~1.5 h, and thereby obtaining an epitaxial graphene of 1~3 layers. In particular, when the pyrolysis time is 30 min, the epitaxial graphene of single layer can be obtained; when the pyrolysis time is 1 hour, the epitaxial graphene of two layers can be obtained; and when the pyrolysis time is 1.5 h, the epitaxial graphene of three layers can be obtained. The more layers of the epitaxial graphene, the easier it is to obtain a more complete graphene plane, so that the ohmic contact performance is better.

In another illustrated embodiment, the graphene can be transferred onto the Si-face of the SiC substrate to form the graphene/SiC structure by graphene transferring instead.

Specifically, a copper foil with a thickness of 25 μm and a purity with a mass ratio of 99.99% is selected and a standard RCA cleaning is performed on the copper foil, and then the copper foil after the cleaning is placed in a reaction chamber of the CVD (chemical vapor deposition) equipment, and subsequently the graphene is grown on the copper foil. The specific process conditions may sequentially include that: introducing 1000 sccm of argon gas into the CVD equipment as a protection gas, and heating up to 1000° C. at 200° C./min; shutting down the argon gas, and introducing 1000 sccm of hydrogen for 5 min; gradually changing the introduced gas to be 960 sccm of argon gas and 40 sccm of hydrogen; and then introducing 10 sccm of methane gas for 10 min; shutting down the methane gas source, cooling down to 300° C. at 200° C./min, then cooling down to 150° C. naturally, closing all gas sources, and vacuuming to 0.1 mbar.

After the growth of graphene on the copper foil, a surface of the copper foil without graphene is pasted/attached onto a thermal releasable tape, and a PMMA (polymethyl methyl acetate) solution is spin-coated onto a surface of the graphene, and the copper foil is removed by a corrosive solution. Because of the tension of solution, the copper foil floats on the surface of the corrosive solution, and the copper foil after corrosion is removed to form a PMMA/graphene structure, and yet the PMMA/graphene structure floats on the corrosive solution. The specific process conditions may be that: a solvent in the PMMA solution is an ethyl lactate with a molecular weight of 960 K and a mass ratio of 4% (4 wt %); a uniform rotation speed is 3000 rpm, and a spin-coating time is 1 min; a temperature of a hot plate (the thermal releasable tape) is set to be 160° C., drying a sample and maintaining for 10 min, and as a result, the copper foil and the thermal releasable tape are separated from each other. After that, the copper foil/graphene/PMMA structure is placed into a 0.5 mol/L of ferric chloride solution for 4 hours. The sample is the copper foil/graphene/PMMA structure adhered to the thermal releasable tape.

The PMMA/graphene structure then is transferred from the corrosive solution to form a PMMA-transferred graphene/SiC structure by using the Si-face of SiC substrate obtained after the above step 2, and a cleaning process subsequently is carried out. The specific process conditions may include that: tilting the SiC substrate to a certain angle by a tweezer, and placing the tilted SiC substrate directly under/below the PMMA/transferred graphene structure, and gently lifting the SiC substrate to form the PMMA/transferred graphene/SiC structure (also referred to as PMMA/graphene/SiC composite structure); placing the PMMA/transferred graphene/SiC structure into a solution of $H_2O$: $H_2O_2$:HCl=20:1:1 for 30 min to remove ions and heavy metal atoms; then putting into another solution of $H_2O$: $H_2O_2$:$NH_4OH$=5:1:1 for 30 min to remove insoluble organic pollutants; and after repeated cleanings by deionized water, drying water between the transferred graphene and the SiC substrate. There are two ways to dry the water between the transferred graphene and the SiC substrate. One way is to dry the water between the transferred graphene and the SiC substrate by using a nitrogen gas gun, and the other way is to touch edges of the transferred graphene lightly by a filter paper to absorb the water under the transferred graphene.

The transferred graphene/SiC structure is formed by removing the PMMA and annealing. The specific process conditions may sequentially include that: removing the PMMA by a hot acetone, washing with an ethanol solution by several times, and cleaning repeatedly with deionized water; and low vacuum annealing, in a mixed atmosphere of hydrogen gas and argon gas, annealing at a temperature of 200° C.~400° C. for 3 hours. Before removing the PMMA, the PMMA/transferred graphene/SiC structure can be placed in a ventilation place for drying, and after the transferred graphene is completely attached onto the SiC substrate, PMMA/transferred graphene/SiC structure is baked by the hot plate, where a baking temperature is 150~200° C. and a baking time is about 10 min. The baking can soften the PMMA film to have flexibility while removing water, so that gaps between the transferred graphene and the SiC substrate can be reduced and their bonding is better consequently.

It is noted that the graphene in the graphene/SiC structures in the illustrated embodiments can be formed by the above-mentioned graphene transferring method and the thermal epitaxial growth method, and the resultant structures each are the graphene/SiC structure (also referred to as graphene/SiC composite structure). The graphene mentioned in the subsequent steps of the second embodiment is the transferred graphene or the epitaxial grown graphene.

Figure 4C:
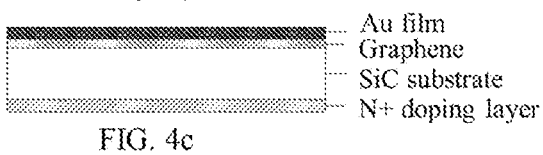

Step 4, referring to FIG. 4c, depositing an Au film on the graphene of the graphene/SiC structure.

Specifically, in an illustrated embodiment, an electron beam evaporation method is used to deposit the Au film of 20~30 nm on the graphene of the graphene/SiC structure. The specific process conditions may be that: a molybdenum crucible is used, a temperature of the graphene/SiC structure is dropped to the room temperature at a high vacuum level of $10^{-7}$ Torr, an evaporation distance is 60 cm, a voltage of an electron gun is 10 kV, a current of the electron gun is 1 A, and an evaporation rate is 1 nm/s. A key factor of the illustrated embodiment is to protect the integrity of the graphene during the ohmic contact preparation process, the damage of the graphene at the contact interface would make the graphene/SiC structure meaningless. The graphene layers is a key structure of blocking diffusion and electromigration of a contact metal. Damaged graphene layer cannot block the diffusion and electromigration of metal atoms, and would cause the increase of specific contact resistance of the model, thereby seriously affecting the ohmic contact properties. Therefore, in the illustrated embodiment, the Au film with the thickness of 20~30 nm is pre-deposited in the process to protect the graphene from being doped and damaged, and also the integrity of graphene is protected, so that a success rate of ohmic contact preparation is improved.

Figure 4D:
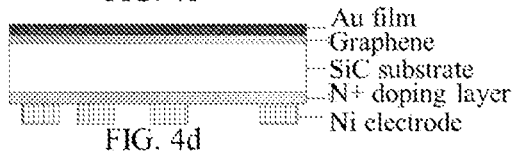

Step 5, referring to FIG. 4d, sputtering a Ni (nickel) metal on the C-face of the SiC substrate to form Ni electrodes.

Specifically, in the illustrated embodiment, a Ni metal is sputtered onto the C-face of the SiC substrate, and the specific process conditions thereof may sequentially include that: placing the cleaned SiC substrate onto the substrate frame/support, turning on cooling waters of a target and a diffusion pump, pre-vacuumizing to a level of $10^5$ Pa by a mechanical pump, and continuing to vacuumize to a level of 2 Pa by the diffusion pump; introducing argon gas and keeping the vacuum level at 20~40 Pa; sputtering the Ni metal, where a working voltage applied onto a cathode is −500 V and a working current is 0.7 A, at this time, it should present a cyan purple glow discharge; sputtering for about 4 min, and then cutting off the power supply and stopping introducing argon gas, and after about 30 min, carrying out the sputtering intermittently until the sputtered Ni metal reaches a predetermined film thickness; stopping the sputtering, stopping introducing argon gas, keeping the SiC substrate at a high vacuum level of 2 Pa for about 40 min and then cooling down; turning off a vacuum measuring instrument, opening an air inlet valve to restore the atmospheric pressure in the chamber, taking out the SiC substrate, and turning off the cooling waters.

After the sputtering, an ohmic contact annealing is carried out. In this case, the process conditions of the ohmic contact annealing may include that: vacuuming an annealing equipment to 4 mbar, introducing nitrogen gas, then vacuuming to 4 mbar, and introducing nitrogen gas of which a flow rate is 2000 sccm; heating up to 400° C. and maintaining for 10 s; heating up to 1000° C. and maintaining for 3 min; cooling down after the annealing, and opening the chamber after cooling for 420 s by cooling water to thereby complete the fabrication of the Ni electrodes.

It should be noted that, as to the graphene transferring method fabricating graphene/SiC, the step of forming the Ni electrodes in step 5 can be carried out before transferring the graphene on the Si-face of the SiC substrate instead, this is because making the Ni electrodes first and then transferring the graphene can reduce the damage to the graphene in the process, and thus designing the process flow in this way can improve the yield.

Figure 4E:
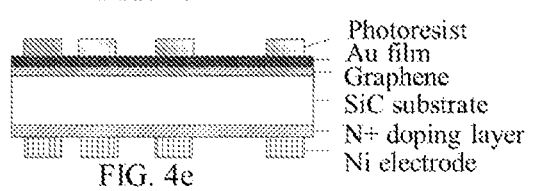

Step 6, referring to FIG. 4e, forming a first transfer electrode pattern on the Au film by a first photolithography.

Specifically, in the illustrated embodiment, the first transfer electrode pattern (e.g., the patterned photoresist shown in FIG. 4e) is formed by first photolithography. The specific process conditions may sequentially include that: spin-coating a photoresist on the Au film at 4000 rpm for 1 min; baking by a hot plate, where a baking temperature is 100° C.; using a mask plate for exposure of 21 mJ/cm$^2$; baking for 90 s on the hot plate of 110° C. and performing flood exposure of 400 mJ/cm$^2$; and developing, concretely soaking the sample in a developing solution of photoresist (such as xylene), gently shaking for 60 s, taking it out, rinsing with deionized water, and drying with a nitrogen gas gun. Herein, the sample is the photoresist and Au film/graphene/SiC composite structure formed after the step 5.

Figure 4F:
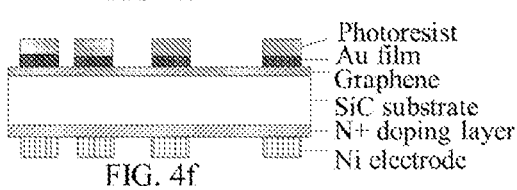

Step 7, referring to FIG. 4f, etching the Au film uncovered/exposed by the first transfer electrode pattern through a wet etching.

Specifically, in the illustrated embodiment, a potassium iodide solution is used to etch the Au film uncovered by the first transfer electrode pattern by the wet etching, that is, to remove the Au film between electrodes.

Figure 4G:
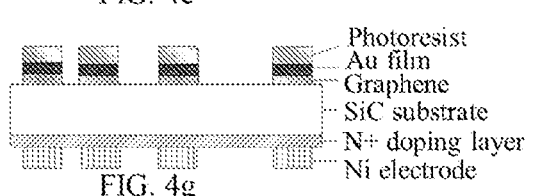

Step 8, referring to FIG. 4g, etching the graphene uncovered/exposed by the Au film through a plasma etching.

Specifically, in the illustrated embodiment, an oxygen plasma etching method is used to remove the graphene uncovered by the Au film. The specific process conditions may be that: an oxygen flow rate is 50 sccm, an ICP power is 500 W, a HF power is 7 W, and an etching time is 15 s.

Figure 4H:
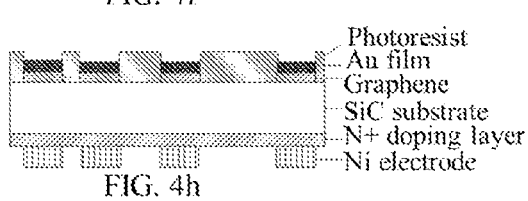

Step 9, referring to FIG. 4h, forming a second transfer electrode pattern on the SiC substrate by a second photolithography.

Specifically, before forming the second transfer electrode pattern (e.g., patterned photoresist shown in FIG. 4h), in the illustrated embodiment, acetone is first used for soaking to remove the photoresist of the first transfer electrode pattern, and specific process conditions may be that: soaking for 12 h in the acetone, taking out, cleaning with acetone ethanol, and then cleaning the sample by deionized water. After that, the second transfer electrode pattern is formed by a photolithography method, and specific process conditions may sequentially include that: spin-coating a photoresist on the SiC substrate at 4000 rpm for 1 min; baking by a hot plate, where a baking temperature is 110° C.; using a mask plate for exposure of 21 mJ/cm$^2$; baking for 90 s on a hot plate of 110° C. and carrying out flood exposure of 400 mJ/cm$^2$; and developing, concretely soaking the sample in an AZ developing solution of TMAH2.38%, lightly shaking for 60 s, then taking it out, rinsing with acetone alcohol, and then drying with a nitrogen gas gun. Herein, the sample is the photoresist and Au film/graphene/SiC structure formed after the step 8.

Figure 4I:
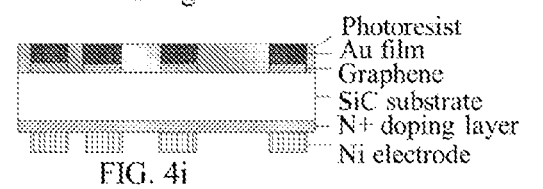

Step 10, referring to FIG. 4*i*, depositing an Au material on the Au film exposed by the second transfer electrode pattern.

Specifically, in the illustrated embodiment, an electron beam evaporation method is used to deposit the Au material with a thickness of 200~300 nm on the Au film exposed by the second transfer electrode pattern. The specific process conditions may be that: a molybdenum crucible is used, a temperature of the Au film/graphene/SiC structure formed after the step 9 is dropped to the room temperature under a high vacuum level of $10^{-7}$ Torr, an evaporation distance is 60 cm, a voltage of an electron gun is 10 kV, a current of the electron gun is 1 A, and an evaporation rate is 1 nm/s.

Figure 4J:
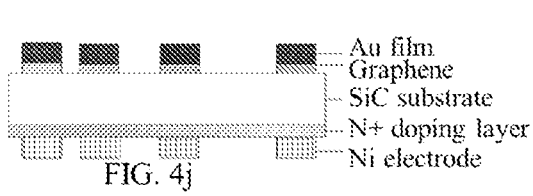

Step 11, referring to FIG. 4*j*, stripping off the second transfer electrode pattern to form Au electrodes and then performing an annealing to complete the preparation of the SiC ohmic contact with the graphene as a diffusion barrier layer.

Specifically, in the illustrated embodiment, the photoresist of the second transfer electrode pattern finally is stripped off and then an annealing process is carried out to form the Au electrodes.

Specifically, as to the stripping off the second transfer electrode pattern to form the Au electrodes, specific process conditions thereof may sequentially include that: soaking the sample in acetone for 12 hours, sucking up a cocked Au metal by a disposable burette/dropper, taking out the sample, cleaning the sample with acetone ethanol, and drying the sample by using a nitrogen gas gun. Herein, the sample is the Au electrode/graphene/SiC composite structure formed after the step 10.

After that, the annealing is carried out, specific process conditions thereof may sequentially include that: clear the chamber before the annealing, concretely vacuuming to 4 mbar, introducing nitrogen gas, then vacuuming again to 4 mbar, and continuing to introduce nitrogen gas of which a flow rate is 2000 sccm (removing residual air in the chamber to ensure nitrogen gas purity); heating up to 400° C. and maintaining for 10 s; then heating up to 600° C. at 10° C./s and maintaining for 30 min; cooling with cooling water for 420 s to complete the annealing, and thereby completing/finishing the preparation of the new SiC ohmic contact with ultra-low contact resistance. The preparation of the new SiC ohmic contact with ultra-low contact resistance may be a preparation of SiC/single-layer epitaxial graphene/Au structure of ohmic contact, a preparation of SiC/two-layers epitaxial graphene/Au structure of ohmic contact, a preparation of SiC/three-layers epitaxial graphene/Au structure of ohmic contact, or a preparation of SiC/single-layer transferred graphene/Au structure of ohmic contact.

In summary, the method for preparing a SiC ohmic contact as provided in the illustrated embodiment is a feasible preparation solution, improves the issues of metal atom diffusion and electromigration of the ohmic contact, and increases the stability and life of power devices. The proposed new structure has brought an inspiration to the research of ohmic contact technology. The existence of graphene reduces the potential barrier associated with the SiC interface, which breaks through the current specific contact resistance of the order of $10^{-5}$ Ω·cm² in practical applications by a new approach, and further reduces the specific contact resistance of ohmic contact. The specific contact resistance of the embodiment can reach the order of $10^{-7} \sim 10^{-8}$ Ω·cm², which can reduce unnecessary power consumption and signal loss caused by ohmic contact and thereby improve the performance of the device. what's more, the preparation method has high repeatability. Moreover, the Au film with the thickness of 20~30 nm is pre-deposited in the process, which can protect the graphene from being doped and damaged, protect the integrity of graphene, and consequently improve the success rate of ohmic contact.

Third Embodiment

In order to achieve the purpose of improving the heat dissipation performance and high temperature stability of an ohmic contact on the basis of without sacrificing the specific contact resistance as much as possible, referring to FIG. 5 and FIG. 6*a*-FIG. 6*h*, and FIG. 5 is a flowchart of still another SiC ohmic contact preparation method according to an embodiment of the disclosure, and FIGS. 6*a*-6*h* are schematic structural views associated with the still another SiC ohmic contact preparation method according to an embodiment of the disclosure. In particular, still another SiC ohmic contact preparation method as provided in the illustrated embodiment may include the following step 1 through step 10.

Step 1, selecting a SiC substrate.

Specifically, the step of selecting the SiC substrate in the illustrated embodiment may include:

selecting a SiC substrate with a surface orientation of (0001) to obtain a selected SiC substrate;

performing a standard RCA cleaning on the selected SiC substrate to obtain a cleaned SiC substrate;

performing a hydrogen etching on a surface of the cleaned SiC substrate, specific process conditions of the hydrogen etching may include that: an etching temperature is 1600° C., an etching time is 90 min, an etching pressure is 96 mbar, and a hydrogen flow rate is 90 L/min; and removing a surface derivative of the SiC substrate after the hydrogen etching, specific process conditions of the removing may sequentially include that: slowly reducing a temperature from 1600° C. to 1000° C., and introducing 2 L/min of hydrogen for 15 minutes; cooling down to 850° C., introducing 0.5 ml/min of SiH4 at a low vacuum level (pressure being 10 e5~10 e2 Pa) for 10 min; heating up to 1000° C. and maintaining for 5 min; raising the temperature to 1100° C. at the low vacuum level and maintaining for 5 min; and heating up to 1250° C. and maintaining for 10 min.

Figure 6A:
FIGS. 6a-6i are schematic structural views associated with the still another SiC ohmic contact preparation method according to an embodiment of the disclosure.

Step 2, referring to FIG. 6*a*, forming a graphene/SiC structure by epitaxially growing, thereby a graphene is formed on a Si-face of the SiC substrate.

Specifically, the thermal damage of a traditional ohmic contact structure mostly occurs at the contact interface, so improving the stability of contact interface is a key to improve the performance of ohmic contact. Graphene is a two-dimensional honeycomb crystal composed of a single layer of carbon atoms and has characteristics/features such as super-high electrical conductivity, thermal conductivity, impermeability and flexibility. The covalent carbon-carbon bond has a high bond energy while the carbon atomic mass is small, as a result, phonons of graphene have a high speed. Graphene transfers heat by way of ballistic diffusion through phonons, so that the graphene has the incomparable thermal conductive advantage than other materials. The thermal conductivity of graphene is the highest in the known materials, which is up to 5300 W/(m·K), and even far beyond the thermal conductivity of metals. The thermal damage at ohmic contact interface can be directly improved by using graphene's excellent in-plane transversal thermal conductivity. Therefore, in the illustrated embodiment, the graphene/SiC structure is formed by epitaxially growing a graphene on the Si-face of the SiC substrate. Specifically, a chemical vapor deposition (CVD) equipment is used to epitaxially grow the graphene on the Si-face of the SiC substrate by a thermal growth method to form graphene/SiC structure. The specific process conditions may sequentially include that: cutting off hydrogen and $SiH_4$, introducing 2 L/min of argon gas, maintaining a pressure in a chamber of the CVD equipment at 5 mbar, heating up to 1650° C., and a pyrolysis time being 30 min~1.5 h, and thereby obtaining an epitaxial graphene of 1~3 layers. In particular, when the pyrolysis time is 30 min, the epitaxial graphene of single layer can be obtained; when the pyrolysis time is 1 hour, the epitaxial graphene of two layers can be obtained; and when the pyrolysis time is 1.5 h, the epitaxial graphene of three layers can be obtained. The more layers of the epitaxial graphene, the easier to obtain a more complete graphene plane, so that the ohmic contact performance is better. The embodiment preferably employs the two-layered epitaxial graphene. In the illustrated embodiment, according to the analysis of difference of surface orientations of SiC substrate, the graphene is epitaxially grown on the Si-face (SiC—Si-face) of the SiC substrate to form the graphene/SiC composite structure.

Figure 6B:

Step 3, referring to FIG. 6b, depositing an Au film on the graphene of the graphene/SiC structure.

Specifically, in an illustrated embodiment, an electron beam evaporation method is used to deposit the Au film of 20-30 nm on the graphene of the graphene/SiC structure. The specific process conditions may be that: a molybdenum crucible is used, a temperature of the graphene/SiC structure is dropped to room temperature at a high vacuum level of $10^{-7}$ Torr, an evaporation distance is 60 cm, a voltage of an electron gun is 10 kV, a current of the electron gun is 1 A, and an evaporation rate is 1 nm/s. A key factor of the illustrated embodiment is to protect the integrity of the graphene during the ohmic contact preparation process. This is because the damage of the graphene at the interface would make the graphene/SiC structure meaningless. The graphene layer is a key structure of reducing heating damage of a contact metal. Damaged graphene layer cannot lower the heating damage of a contact metal, and would cause the increase of specific contact resistance of the model, thereby seriously affecting the ohmic contact performances. Therefore, in the illustrated embodiment, the Au film with the thickness of 20~30 nm is pre-deposited in the process to protect the graphene from being doped and damaged, and the integrity of graphene is protected, so that a success rate of ohmic contact is improved.

Figure 6C:
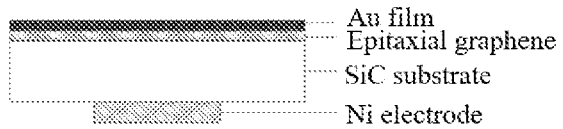

Step 4, referring to FIG. 6c, sputtering a Ni metal on the C-face of SiC substrate to form a Ni electrode.

Specifically, in order to form an ohmic contact on the C-face of the SiC substrate, in the illustrated embodiment, before sputtering the Ni metal on the C-face of the SiC substrate, N ions are first implanted into the C-face of the SiC substrate with a preset depth and a preset concentration. Because the ions implantation for preparing an ohmic contact expects a box-shaped distribution of doping concentration, but the distribution available in the conventional implantation generally is a Gaussian distribution, the illustrated embodiment first prepares a masking layer before the ions implantation to accommodate the Gauss distribution which is not wanted. Specifically, in the illustrated embodiment, a CVD equipment is used to grow a $SiO_2$ masking layer of 80~120 nm on the C-face of the SiC substrate. The specific process conditions may be that: an oxidation temperature is controlled to be 1180° C., an oxygen flow rate is 540 ml/min, and an oxidation time is controlled to be 165 min. After the completion of the oxidation process, the CVD temperature is kept unchanged and $N_2$ gas is intruded to anneal for 30 min, and then the sample is cooled down to below 300° C. at the $N_2$ gas atmosphere. After the oxidation of SiC, annealing is needed to eliminate residual C atoms in the $SiO_2$ masking layer and thereby improve interface properties of $SiC/SiO_2$. The specific process conditions of the annealing may sequentially include that: vacuuming an annealing equipment to 4 mbar, introducing nitrogen gas, then vacuuming to 4 mbar, and introducing nitrogen gas of which a flow rate is 2000 sccm; heating up to 400° C. and maintaining for 10 s; heating up to 1000° C. and maintaining for 3 min; and cooling down after the annealing and opening the chamber after cooling for 420 s by cooling water.

After the masking layer is fabricated, implanting N ions with a preset depth of 300~350 nm and a preset concentration of $0.99 \times 10^{20}$~$1.01 \times 10^{20}$ $cm^{-3}$ by the masking layer into the SiC substrate. The specific process conditions may include that: implanting the N ions by four times, and the energies/doses of the four times of N ion implantations are 150 kev/$3.1 \times 10^{15}$ $cm^{-2}$, 100 keV/$1.75 \times 10^{15}$ $cm^{-2}$, 62 keV/$1.45 \times 10^{15}$ $cm^{-2}$, and 35 keV/$1.1 \times 10^{15}$ $cm^{-2}$ respectively, so as to realize the N ions implantation with the preset depth and concentration. The energies and doses for the N ions implantations in the illustrated embodiment can be any combination as long as meeting the distributions of the preset depth and the preset concentration, and the control of the preset depth and the preset concentration has a great influence on the structure of the embodiment.

After the N ions implantation, a plasma etching is used to etch the masking layer, and specific process conditions thereof may be that: a flow rate of $CF_4$ is 40 sccm, a RF power is 400 W, a gas pressure is 5 Pa, and an etching time is 1.5 min. After the etching, a high temperature activation annealing is performed. In this situation, process conditions of the high temperature activation may sequentially include that: vacuuming an annealing equipment to 4 mbar, introducing nitrogen gas, then vacuuming to 4 mbar again, and introducing nitrogen gas of which a flow rate is 2000 sccm; heating up to 400° C. and maintain for 10 s; heating up to 1700° C. at 10° C./s and maintaining for 30 min; and cooling down after the annealing, and opening the chamber after cooling for 420 s by cooling water.

Finally, in the illustrated embodiment, the Ni metal is sputtered onto the C-face of the SiC substrate implanted with the N ions, and the specific process conditions may sequentially include that: placing the cleaned SiC substrate onto the substrate frame/support, turning on cooling waters of a target and a diffusion pump, pre-vacuumizing to a level of $10^5$ Pa by a mechanical pump, and continuing to vacuumize to a level of 2 Pa by the diffusion pump; introducing argon gas and keeping the vacuum level at 20~40 Pa; sputtering the Ni metal, a working voltage applied onto a cathode is −500 V and a working current is 0.7 A, at this time, it should present a cyan purple glow discharge; sputtering for about 4 min, and then cutting off the power supply and stopping introducing argon gas; and after about 30 min, carrying out the sputtering intermittently until the sputtered Ni metal reaches a predetermined film thickness; stopping the sputtering, stopping introducing argon gas, keeping the SiC substrate at a high vacuum level of 2 Pa for about 40 min and then cooling down; turning off a vacuum measuring instrument, opening an air inlet valve to restore the atmospheric pressure in the chamber, taking out the SiC substrate, and turning off the cooling waters.

After the sputtering, an ohmic contact annealing is performed. At this situation, the process conditions of the ohmic contact annealing may include that: vacuuming an annealing equipment to 4 mbar, introducing nitrogen gas, then vacuuming to 4 mbar again, introducing nitrogen gas of which a flow rate is 2000 sccm; heating up to 400° C. and maintaining for 10 s; heating up to 1000° C. and maintaining for 3 min; cooling down after the annealing, and opening the chamber after cooling for 420 s by cooling water to thereby complete the fabrication of the Ni electrode.

Figure 6D:

Step 5, referring to FIG. 6d, forming a first transfer electrode pattern on the Au film by a first photolithography.

Specifically, in the illustrated embodiment, the first transfer electrode pattern (e.g., the patterned photoresist shown in FIG. 6d) is formed by photolithography. The specific process conditions may sequentially include that: spin-coating a photoresist on the Au film at 4000 rpm for 1 min; baking by a holt plate, where a baking temperature is 100° C.; using a mask plate for exposure of 21 mJ/cm$^2$; baking for 90 s on the hot plate of 110° C. and carrying out flood exposure of 400 mJ/cm$^2$; and developing, concretely soaking the sample in a developer solution of photoresist (such as xylene), gently shaking for 60 s, taking it out, rinsing with deionized water, and drying by a nitrogen gas gun. Herein, the sample is the Au film/graphene/SiC composite structure formed after the step 4.

Figure 6E:
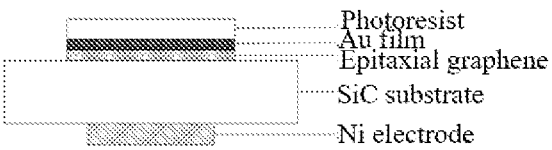

Step 6, referring to FIG. 6e, etching the Au film uncovered by the first transfer electrode pattern through a wet etching.

Specifically, in the illustrated embodiment, a potassium iodide solution is used to etch the Au film uncovered by the first transfer electrode pattern by the wet etching, that is, to remove some of the Au film.

Step 7, referring to FIG. 6e, etching the graphene uncovered by the Au film through a plasma etching.

Specifically, in the illustrated embodiment, an oxygen plasma etching method is used to remove the graphene uncovered by the Au film. The specific process conditions may be that: an oxygen flow rate is 50 sccm, an ICP power is 500 W, a HF power is 7 W, and an etching time is 15 s.

Figure 6F:
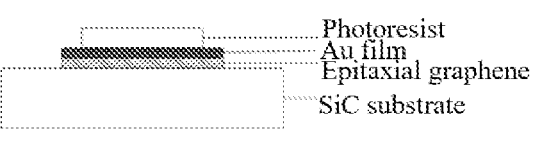

Step 8, referring to FIG. 6f, forming a second transfer electrode pattern on the Au film by a second photolithography.

Specifically, before forming the second transfer electrode pattern, the photoresist of the first transfer electrode pattern is first removed by soaking in acetone, and specific process conditions thereof may include that: soaking a sample in acetone for 12 hours, taking out the sample, cleaning the sample with acetone ethanol, cleaning the sample with deionized water, and drying the sample by using a nitrogen gas gun. In the illustrated embodiment, the second transfer electrode pattern is formed by the second photolithography, and specific process conditions thereof may include that: spin-coating a photoresist on the Au film at 4000 rpm for 1 min; baking by a hot plate, where a baking temperature is 100° C.; using a mask plate for exposure of 21 mJ/cm$^2$; baking for 90 s on the hot plate of 110° C. and performing flood exposure of 400 mJ/cm$^2$; and developing, concretely soaking the sample in a developer solution of photoresist (such as xylene), shaking for 60 s, then taking it out, cleaning with deionized water, and drying with a nitrogen gas gun. Herein, the sample is the Au film/graphene/SiC composite structure formed after the step 7.

Figure 6G:

Step 9, referring to FIG. 6g, etching the Au film uncovered by the second transfer electrode pattern through a wet etching.

Specifically, the illustrated embodiment uses a potassium iodide solution to etch the Au film uncovered by the second transfer electrode pattern by the wet etching, that is, to remove some of the Au film.

Figure 6H:

Step 10, referring to FIG. 6h, forming a third transfer electrode pattern on the SiC substrate and the graphene by a third photolithography.

Specifically, before forming the third transfer electrode pattern (e.g., patterned photoresist shown in FIG. 6h), in the illustrated embodiment, the photoresist of the second transfer pattern is first removed, and the photoresist of the second transfer electrode pattern is removed by soaking in acetone. The specific process conditions may include that: soaking in acetone for 12 h, taking out the sample, cleaning with acetone ethanol, cleaning the sample with deionized water, and drying with a nitrogen gas gun.

Then, a third transfer electrode pattern is formed on the SiC substrate as well as graphene by photolithography, and specific process conditions may include that: spin-coating a photoresist on the SiC substrate and the graphene at 4000 rpm for 1 min; baking by a hot plate, where a baking temperature is 100° C.; using a mask plate to carry out an exposure of 21 mJ/cm$^2$; baking for 90 s on the hot plate of 110° C. and carrying out a flood exposure of 400 mJ/cm$^2$; and developing, concretely soaking the sample in a developer solution of photoresist (such as xylene), gently shaking for 60 s, then taking it out, cleaning with deionized water, and drying with a nitrogen gas gun. Herein, the sample is the Au film/graphene/SiC composite structure formed after the step 9.

Figure 6I:

Step 11, referring to FIG. 6i, depositing an Au material on a surface of composite structure formed after the step 10 exposed by the third transfer electrode pattern.

Specifically, in the illustrated embodiment, the Au material with a thickness of 200~300 nm is deposited by using an electron beam evaporation method to form the Au electrode, and specific process conditions may be that: a molybdenum crucible is used, a temperature of the photoresist and Au film/graphene/SiC composite structure formed after the step 10 is dropped to room temperature at a high vacuum level of $10^{-7}$ Torr, an evaporation distance is 60 cm, a voltage of an electron gun is 10 kV, a current of the electron gun is 1 A, and an evaporation rate is 1 nm/s. Then, stripping off the third transfer electrode pattern, and the specific process conditions thereof may include that: soaking the sample in acetone for 12 hours, sucking up a cocked Au metal by a disposable burette/dropper, taking out the sample, cleaning the sample by acetone ethanol, and drying the sample by using a nitrogen gas gun. Herein, the sample is the photoresist and Au/graphene/SiC structure formed after the step 10.

After that, the annealing is carried out, specific process conditions thereof may sequentially include: clearing the chamber before the annealing, concretely vacuuming to 4 mbar, introducing nitrogen gas, then vacuuming again to 4 mbar, and continuing to introduce nitrogen gas of which a flow rate is 2000 sccm (removing residual air in the chamber to ensure nitrogen gas purity); heating up to 400° C. and maintaining for 10 s; then heating up to 600° C. at 10° C./s and maintaining for 30 min; cooling with cooling water for 420 s to complete the annealing, and thereby completing/finishing the preparation of the new type of SiC ohmic contact with ultra-low contact resistance. The preparation of the new SiC ohmic contact with ultra-low contact resistance may be a preparation of SiC/single-layer epitaxial graphene/Au structure of ohmic contact, a preparation of SiC/two-layers epitaxial graphene/Au structure of ohmic contact, or a preparation of SiC/three-layers epitaxial graphene/Au structure of ohmic contact.

In summary, the method for preparing a SiC ohmic contact as provided in the illustrated embodiment is a feasible preparation solution, and uses the ultra-high thermal conductivity and stability of the graphene to solve the thermal damage problems of ohmic contact interfaces of high heat consumption devices and high temperature working devices. Compared with the traditional ohmic contact structure, the new structure prepared by the illustrated embodiment has better high temperature electrical performance and more stability, which brings inspiration to the research of ohmic contact technology. The existence of graphene reduces the potential barrier associated with the SiC interface, which breaks through the current specific contact resistance of the order of $10^{-5}$ $\Omega \cdot cm^2$ in practical applications from a new approach, and further reduces the specific contact resistance of ohmic contact. The specific contact resistance of the embodiment can reach the order of $10^{-7} \sim 10^{-8}$ $\Omega \cdot cm^2$, which can reduce unnecessary power consumption and signal loss caused by ohmic contact and thereby improve the performance of the device. What's more the preparation method here has high repeatability. Moreover, the Au film with the thickness of 20~30 nm is pre-deposited in the process, which can protect the graphene from being doped and damaged, protect the integrity of graphene, and consequently improve the success rate of ohmic contact.

The above content is a detailed description of the disclosure in combination with specific preferred embodiments, and it cannot be considered that specific implementations of the disclosure are limited to these descriptions. For those ordinary skilled in the art of the disclosure, simple deductions or substitutions can be made without departing from the concept of the disclosure, which should all be regarded as belonging to the protection scope of the disclosure.

What is claimed is:

1. A silicon carbide (SiC) ohmic contact preparation method, comprising:
    selecting a SiC substrate;
    preparing a graphene/SiC structure by forming a graphene on a silicon-face (Si-face) of the SiC substrate;
    depositing a gold (Au) film on the graphene of the graphene/SiC structure;
    forming a first transfer electrode pattern on the Au film by a first photolithography;
    etching the Au film uncovered by the first transfer electrode pattern through a wet etching;
    etching the graphene uncovered by the Au film through a plasma etching after the wet etching;
    forming a second transfer electrode pattern on the SiC substrate by a second photolithography; and
    depositing an Au material on the Au film exposed by the second transfer electrode pattern and forming an Au electrode and then annealing, so as to obtain a SiC ohmic contact.

2. The SiC ohmic contact preparation method according to claim 1, wherein the preparing a graphene/SiC structure by forming a graphene on a Si-face of the SiC substrate comprises:
    using a chemical vapor deposition (CVD) equipment to prepare the graphene/SiC structure through a thermal growth method of epitaxially growing the graphene on the SiC substrate, and process conditions including: cutting off hydrogen and silicon-tetrahydride (SiH$_4$), introducing 2 liters per minute (L/min) of argon gas, maintaining a pressure in the CVD equipment at 5 mbar, heating up to 1650° C., and a pyrolysis time being 30 minutes (min)~1.5 hours (h).

3. The SiC ohmic contact preparation method according to claim 1, wherein the depositing an Au film on the graphene of the graphene/SiC structure comprises:
    using an electron beam evaporation to deposit the Au film with a thickness of 20~30 nanometers (nm) on the graphene of the graphene/SiC structure, and process conditions including that: a molybdenum crucible is used, a temperature of the graphene/SiC structure is dropped to room temperature at a vacuum level of $10^{-7}$ Torr, an evaporation distance is 60 centimeters (cm), a voltage of an electron gun is 10 kilovolts (kV), a current of the electron gun is 1 ampere (A), and an evaporation rate is 1 nanometer per second (nm/s).

4. The SiC ohmic contact preparation method according to claim 1, wherein the depositing an Au material on the Au film exposed by the second transfer electrode pattern comprises:
    using an electron beam evaporation to deposit the Au material with a thickness of 200~300 nm on the Au film exposed by the second transfer electrode pattern, and process conditions including that: a molybdenum crucible is used, a temperature of a composite structure with the Au film and the graphene/SiC structure is dropped to room temperature at a vacuum level of $10^{-7}$ Torr, an evaporation distance is 60 cm, a voltage of an electron gun is 10 kV, a current of the electron gun is 1 A, and an evaporation rate is 1 nm/s.

5. The SiC ohmic contact preparation method according to claim 1, wherein the forming an Au electrode and then annealing comprises:
    stripping off the second transfer electrode pattern to form the Au electrode, and process conditions of the stripping off sequentially including: soaking a composite structure with the Au material, the Au film and the graphene/SiC structure in acetone for 12 h, sucking up a cocked Au metal by a disposable burette, taking out the soaked composite structure, cleaning with acetone ethanol, and drying by a nitrogen gas gun; and
    carrying out the annealing, and process conditions of the annealing sequentially including: before the annealing, vacuuming to 4 mbar, introducing nitrogen gas, then vacuuming to 4 mbar again, and continuing to introduce nitrogen gas of which a flow rate is 2000 standard cubic centimeter per minute (sccm); heating up to 400° C. and maintaining for 10 seconds (s); heating up to 600° C. at 10° C./s and maintaining for 30 minutes (min); and cooling with cooling water for 420 s.

6. The SiC ohmic contact preparation method according to claim 1, wherein the preparing a graphene/SiC structure by forming a graphene on a Si-face of the SiC substrate comprises:
    transferring the graphene onto the Si-face of the SiC substrate to prepare the graphene/SiC structure.

7. The SiC ohmic contact preparation method according to claim 6, wherein the transferring the graphene onto the Si-face of the SiC substrate to prepare the graphene/SiC structure comprises:
    selecting a copper foil and using a CVD equipment to grow the graphene on the copper foil, and process conditions sequentially including: introducing 1000 sccm of argon gas into the CVD equipment and heating up to 1000° C. at 200° C./min; shutting down the argon gas and introducing 1000 sccm of hydrogen gas for 5 min; gradually changing the introduced gas to be 960 sccm of argon gas and 40 sccm of hydrogen gas and introducing 10 sccm of methane gas for 10 min; and shutting down a source of the methane gas, cooling down to 300° C. at 200° C./min, then cooling down to 150° C. naturally, closing all gas sources, and vacuuming to 0.1 mbar;

spin-coating a polymethyl methacrylate (PMMA) solution onto a surface of the graphene, removing the copper foil by a corrosive solution to form a PMMA/graphene composite structure, and floating the PMMA/graphene composite structure on the corrosive solution, and process conditions including: a spin-coating speed is 3000 revolutions per minute (rpm), a spin-coating time is 1 min, the corrosive solution is a ferric chloride solution of 0.5 mole per liter (mol/L), and a corrosion time is 4 h;

using the SiC substrate to transfer the PMMA/graphene composite structure from the corrosive solution to thereby form a PMMA/graphene/SiC composite structure and then cleaning the PMMA/graphene/SiC composite structure, and process conditions sequentially including: tilting the SiC substrate at an angle by a tweezer, placing the SiC substrate directly below the PMMA/graphene composite structure and lifting the SiC substrate; placing the PMMA/graphene/SiC composite structure into a solution of $H_2O:H_2O_2:HCl=20:1:1$ for 30 min, then placing into another solution of $H_2O:H_2O_2:NH_4OH=5:1:1$ for 30 min; and subsequently repeatedly cleaning by deionized water; and drying water between the graphene and the SiC substrate; and removing the PMMA and annealing to form the graphene/SiC structure, and process conditions sequentially including: removing the PMMA by hot acetone, washing with ethanol solution, and cleaning repeatedly with deionized water; and vacuum annealing, concretely in a mixed atmosphere of hydrogen and argon, annealing at 200° C.~400° C. for 3 h.

8. The SiC ohmic contact preparation method according to claim 1, further comprising:

implanting N ions into a carbon-face (C-face) of the SiC substrate with a preset depth and a preset concentration; and sputtering a nickel (Ni) metal on the C-face of the SiC substrate implanted with the N ions to form a Ni electrode.

9. The SiC ohmic contact preparation method according to claim 8, wherein the implanting N ions into a C-face of the SiC substrate with a preset depth and a preset concentration comprises:

using a CVD equipment to grow a masking layer with a thickness of 80~120 nm on the C-face of the SiC substrate;

implanting the N ions through the masking layer into the SiC substrate with the preset depth of 300~350 nm and the preset concentration of $0.99\times10^{20}$~$1.01\times10^{20}$ $cm^{-3}$; and etching off the masking layer by a plasma etching after the implanting.

10. A silicon carbide (SiC) ohmic contact preparation method, comprising:

selecting a SiC substrate;

forming a graphene/SiC composite structure by epitaxially growing a graphene on a Si-face of the SiC substrate;

depositing an Au film on the graphene of the graphene/SiC composite structure;

forming a Ni electrode by sputtering a Ni metal on a C-face of the SiC substrate;

forming a first transfer electrode pattern on the Au film by a first photolithography;

etching the Au film uncovered by the first transfer electrode pattern by a wet etching;

etching the graphene uncovered by the Au film by a plasma etching;

forming a second transfer electrode pattern on the Au film by a second photolithography;

etching the Au film uncovered by the second transfer electrode pattern through a wet etching;

forming a third transfer electrode pattern on the SiC substrate and the graphene by a third photolithography; and depositing an Au material on the graphene and the SiC substrate to form an Au electrode and then annealing, so as to obtain a SiC ohmic contact.

* * * * *